United States Patent [19]

Inata et al.

[11] Patent Number: 4,825,264

[45] Date of Patent: Apr. 25, 1989

[54] RESONANT TUNNELING SEMICONDUCTOR DEVICE

[75] Inventors: Tsuguo Inata; Shunichi Muto, both of Isehara; Toshio Fujii, Atsugi, all of Japan

[73] Assignee: Fujitsu Limited, Kawasaki, Japan

[21] Appl. No.: 81,340

[22] Filed: Aug. 4, 1987

[30] Foreign Application Priority Data

Aug. 4, 1986 [JP] Japan .................. 61-183101
May 12, 1987 [JP] Japan .................. 62-113590

[51] Int. Cl.$^4$ ............... H01L 27/12; H01L 45/00; H01L 29/161; H01L 29/72
[52] U.S. Cl. .......................... 357/4; 357/16; 357/34; 357/61
[58] Field of Search .............. 357/4, 16, 34, 61

[56] References Cited

U.S. PATENT DOCUMENTS

| | | | |
|---|---|---|---|
| 4,396,931 | 8/1983 | Dumke et al. | 357/4 |
| 4,532,533 | 7/1985 | Jackson et al. | 357/4 |
| 4,616,241 | 10/1986 | Biefeld et al. | 357/16 |
| 4,712,121 | 12/1987 | Yokoyama | 357/4 |

FOREIGN PATENT DOCUMENTS

| | | |
|---|---|---|
| 0177374 | 4/1986 | European Pat. Off. |
| 0226383 | 6/1987 | European Pat. Off. |
| 2833543 | 2/1979 | Fed. Rep. of Germany ........ 357/16 |

OTHER PUBLICATIONS

Japanese Journal of Applied Physics, vol. 25, No. 8, Aug. 1986, "Conduction Band Edge Discontinuity of In0.52Ga0.48As/In0.52(Ga1-xAlx)0.48As (0≦x≦1) Heterostructures", by Sugiyama et al., pp. L648–L650.

Applied Physics Letters, vol. 45, No. 12, Dec. 15, 1984, "Quantum Well Oscillators", by Sollner et al., pp. 1319–1321.

Applied Physics Letters, vol. 48, No. 26, Jun. 30, 1986, "InGaAs/InAlAs Hot-Electron Transistor", Reddy et al., pp. 1799–1801.

International Electron Devices Meeting, Technical Digest, Dec. 1–4, 1985, "Observation of Negative Conductance by Sequential Resonant Tunneling Through a One-Micron Thick Superlattice", by Capasso et al., pp. 764–765.

"Excellent Negative Differential Resistance of InAlAs-/InGaAs Inata et al., Resonant Tunneling Barrier Structures Grown by MBE", Japanese Journal of Applied Physics, vol. 25, No. 12, Dec. 1986, pp. L983–L985.

Muto et al. "Quantum Well Width Dependence of Negative Differential Resistance of In0.52Al0.48As/In0.53Ga0.47As Resonant Tunneling Barriers Grown by MBE", Japanese Journal of Applied Physics, vol. 26, No. 3, Mar. 1987, pp. L220–L222.

Osbourn, "Strained-Layer Superlattices from Lattice Mismatched Materials", J. Appl. Phys. vol. 53, No. 3, Mar. 1982.

T. H. H. Vuong and D. C. Tsui, "Tunneling in $In_{0.53}Ga_{0.47}As$-InP Double-Barrier Structures", Appl. Phys. Lett., vol. 50(4) Jan. 1987.

*Primary Examiner*—Eugene R. LaRoche
*Assistant Examiner*—Michael Shingleton
*Attorney, Agent, or Firm*—Staas & Halsey

[57] ABSTRACT

A resonant tunneling semiconductor device having a large peak-to-valley current density $J_p/J_v$ ratio comprises an InP substrate, a first contact compound semiconductor lattice-matched to Inp, a first barrier layer of $(In_{0.52}Al_{0.48}As)_z(In_{0.53}Ga_{0.47}As)_{1-z}$, $(0 < z \leq 1)$, a well layer of $In_{1-y}Ga_yAs$, $(0.48 \geq y \geq 0.46)$, a second barrier layer of $(In_{0.52}Al_{0.48}As)_z - (In_{0.53}Ga_{0.47}As)_{1-z}$, $(0 < z \leq 1)$, and a second contact layer compound semiconductor lattice-matched to InP: The first and second barrier layers and the well layer forming a quantum-well structure.

Instead of the quantum-well structure above, it is possible to adopt the quantum-well structure of strained-layers comprising first and second barrier layers which are of $In_{1-x}Al_xAs$ $(0.48 < x \leq 1)$ and have a thickness of 0.5 to 10.0 nm.

28 Claims, 9 Drawing Sheets

PRIOR ART

RESONANT TUNNELING SEMICONDUCTOR DEVICE

BACKGROUND OF THE INVENTION

1. Field of the Invention

The present invention relates to a compound semiconductor device, and more particularly, to a resonant tunneling semiconductor device having a negative differential resistance characteristic caused by resonant tunneling phenomenon.

2. Description of the Related Art

The resonant tunneling semiconductor device uses a resonant tunneling barrier structure, i.e., a quantum-well structure, comprising two barrier layers and a well layer sandwiched therebetween. The resonant tunneling of a carrier (i.e., electron) occurring in the structure provides the negative resistance characteristic.

Figure 1:
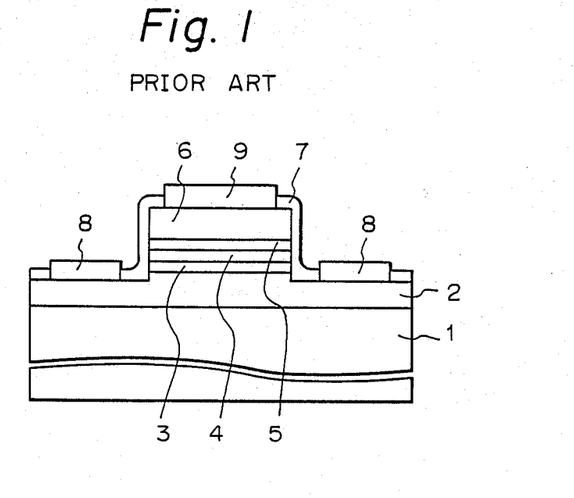
FIG. 1 is a schematic sectional view of a conventional RTB diode.

Resonant tunneling semiconductor devices such as a resonant tunneling barrier (RTB) diode, a resonant tunneling bipolar transistor (RBT) and a resonant tunneling hot electron transistor (RHET), have been proposed. For example, EP No.-017734-A2 (corresponding to U.S. Ser. No. 754,416) discloses a type of RHET. FIG. 1 shows a known RTB diode. This RTB diode comprises a substrate 1, a first contact layer 2, a first barrier layer 3, a well layer 4, a second barrier layer 5, a second contact layer 6, a protective insulating layer 7, a first ohmic-contact electrode 8, and a second ohmic-contact electrode layer 9.

The data of the above-mentioned parts of the RTB diode is as follows, by way of example.

(a) Substrate 1
Material: semi-insulating GaAs
(b) First contact layer 2
Material: n-type GaAs
Impurity concentration: $1 \times 10^{18}$ cm$^{-3}$
Thickness: 0.5 μm
(c) First barrier layer 3
Material: i-type Al$_{0.33}$Ga$_{0.67}$As
Thickness: 50 Å (5.0 nm)
(d) Well layer 4
Material: i-type GaAs
Thickness: 56 Å (5.6 nm)
(e) Second barrier layer 5
Material: i-type Al$_{0.33}$Ga$_{0.67}$As
Thickness: 50 Å (5.0 nm)
(f) Second contact layer 6
Material: n-type GaAs
Impurity concentration: $1 \times 10^{18}$ cm$^{-3}$
Thickness: 0.3 μm
(g) Protective insulating layer 7
Material: Silicon dioxide (SiO$_2$)
Thickness: 0.3 μm In the RTB diode, the first and second barrier layers 3 and 5 and the well layer 4 having a thickness of less than the de Broglie wavelength of the carrier (i.e., electron) form a quantum-well structure.

Figure 2:
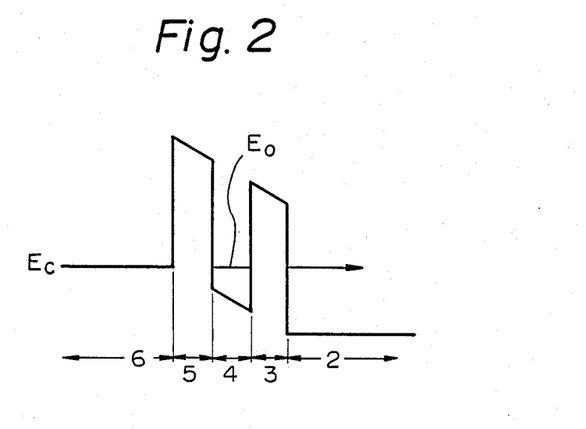
FIG. 2 is a conduction energy-band diagram of the RTB diode under a bias condition.

FIG. 2 shows a conduction energy-band diagram of the RTB diode, for explaining the operation thereof when a bias voltage is applied to the RTB diode. In the drawing, "E$_c$" and "E$_0$" indicate the bottom of the conduction band and the first resonant level for the electron in the well layer 4, respectively. Where the first contact layer 2 applies a positive potential to the second contact layer 6, to correspond the bottom E$_c$ of the conduction band of the second contact layer 6 with the first resonant level E$_0$ in the well layer 4, as shown in FIG. 2, namely, where the voltage V between the first and second contact layers 2 and 6 becomes:

$$V \approx 2E_0/q$$

wherein q is the electric charge of the electron, electrons tunnel from the second contact layer 6 to the first contact layer 2 through the barriers due to the resonant tunneling effect, and thus a current flows in the RTB diode. On the other hand, where the voltage V becomes $V > 2E_0/q$ or $V < 2E_0/q$, such the voltage conditions are different to the resonant tunneling condition, the amount of electrons tunneling into the first contact layer 2 is remarkably decreased, and thus very little current flows.

Figure 3:
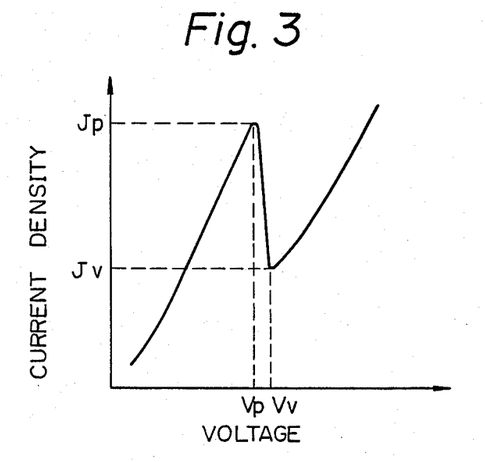
FIG. 3 is current-voltage characteristics diagram of the RTB diode.

FIG. 3 show a current-voltage characteristic of the RTB diode, in which the abscissa axis and the ordinate axis represent the voltage and the current density, respectively. In the drawing, "V$_p$" indicate a voltage at which a maximum current (peak current) flows due to the occurrence of resonant tunneling, "V$_v$" indicates a voltage at which a minimum current (valley current) flows when resonant tunneling does not occur, J$_p$ indicates a maximum current density, and J$_v$ indicates a minimum current density.

As can be seen from FIG. 3, the current first increases as a voltage increases. When the voltage becomes V$_p$, the current reaches the maximum current density J$_p$, and then the current sharply decreases. When the voltage becomes V$_v$, the current reaches the minimum current density J$_v$, and thereafter, the current increases again. Namely, where the voltage varies from V$_p$ to V$_v$, the current density decreases from J$_p$ to J$_v$ for the voltage increase, and thus a negative resistance characteristic appears.

Figure 4:
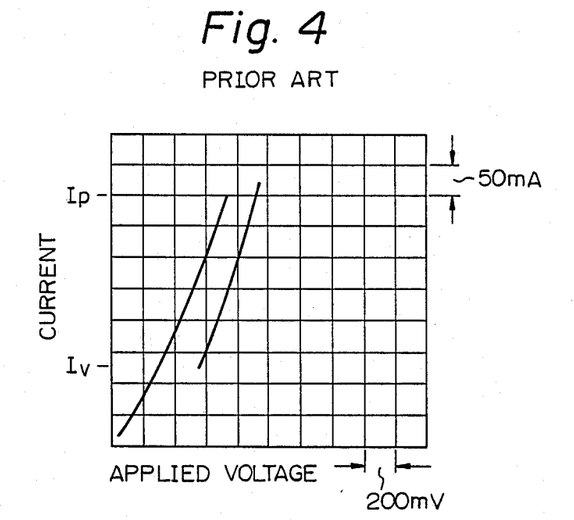
FIG. 4 is a current-voltage characteristics diagram of the RTB diode (50 μm in diameter) at 77° K.

FIG. 4 shows a current-voltage characteristic of a conventional RTB diode having a diameter of 50 μm, which was obtained by measurement under a temperature of 77° K. In the drawing, the abscissa axis represents applied voltage and each graduation on the scale thereof represents 200 mV. The ordinate axis represents current and each graduation on the scale thereof represents 50 mA. In this case, as can be seen from FIG. 4, the applied voltage corresponding to the minimum current I$_v$ is shifted to a lower voltage side with respect to the voltage corresponding to the maximum current I$_p$, which occurs because of variations of the amount of voltage drop due to a series resistance component.

Figure 5:
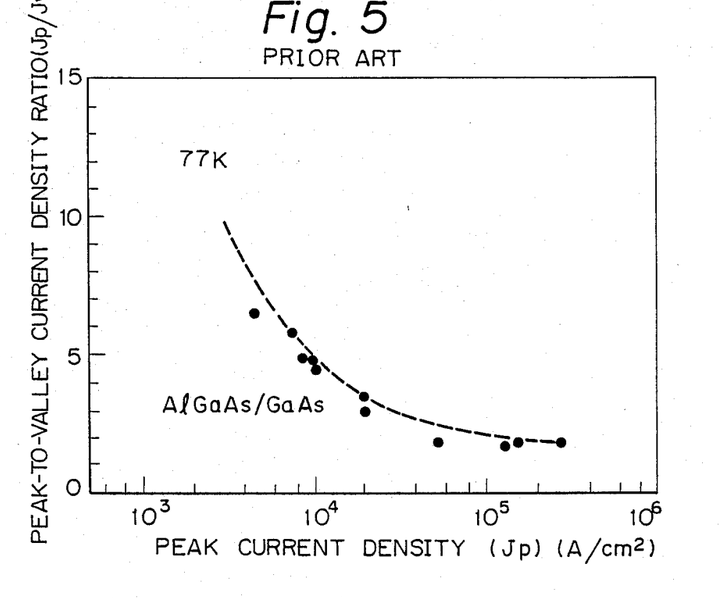
FIG. 5 is a graph showing a relationship between $J_p/J_v$ ratios and the $J_p$ of AlGaAs/GaAs RTB diodes.

The above-mentioned negative differential resistance characteristics in the RTB diode can be also obtained in an RHET and can be used in the constitution of logic circuits, frequency multipliers, oscillation circuits, etc., to reduce the number of elements required for those functions. In such cases, in order to operate the circuits at a high-speed and with a large noise margin, the ratio of the maximum current density to the minimum current density (peak-to valley current density ratio, J$_p$/J$_v$) must be large and the maximum (peak) current density J$_p$ must be large. The negative differential resistance characteristics including the J$_p$/J$_v$ ratio and the J$_p$ value can vary in accordance with a barrier height of the quantum-well structure, a width (thickness) of the barrier layers, a width (thickness) of a well layer, an impurity concentration of the contact layers lying outside the barrier layers, and the like. Conventional AlGaAs/GaAs RTB diodes have maximum (peak) current density J$_p$ values and peak-to-valley current density (J$_p$/J$_v$) ratios, as shown in FIG. 5. As can be seen from the drawing, as the maximum current density $J_p$ increases, the $J_p/J_v$ ratio decreases. For example, when the $J_p$ value is approximately equal to $2 \times 10^4$ A/cm$^2$, the $J_p/J_v$ ratio is approximately equal to 3. Thus, in the conventional negative resistant element of an AlGaAs/GaAs system, where the $J_p$ value is made larger, the $J_p/J_v$ ratio decreases.

SUMMARY OF THE INVENTION

An object of the present invention is to provide a resonant tunneling semiconductor device having negative differential resistance characteristics in which a maximum (peak) current density $J_p$ and a maximum/-minimum (peak-to-valley) current density ($J_p/J_v$) ratio are high.

Another object of the present invention is to improve the operating speed and the noise margin of electric circuits including the resonant tunneling semiconductor devices.

According to the first embodiment of the present invention, there is provided a resonant tunneling semiconductor device comprising: an InP substrate; a first contact compound semiconductor layer formed on the InP substrate and lattice-matched to InP; a first barrier layer of $(In_{0.52}Al_{0.48}As)_z (In_{0.53}Ga_{0.47}As)_{1-z}$ ($0 < z \leq 1$) formed on the first contact layer, and lattice-matched to InP; a well layer of $In_{1-y}Ga_yAs$ formed on the first barrier layer, and substantially lattice-matched to InP; a second barrier layer of $(In_{0.52}Al_{0.48}As)_z(In_{0.53}Ga_{0.47}As)_{1-z}$ ($0 < z \leq 1$) formed on the well layer and lattice-matched to InP; and a second contact compound semiconductor layer formed on said second barrier layer and lattice-matched to InP; the first barrier layer, the second barrier layer, and the well-layer forming a quantum-well structure, and the bottom of conduction band $E_c$ of the first and second contact layers being lower than the first resonant level $E_o$ in the quantum-well at the nonbiased condition.

In this case, since each of the $(In_{0.52}Al_{0.48}As)$ and $(In_{0.53}Ga_{0.47}As)$ is a lattice-matched to InP, the quaternary compound semiconductor [InAl(Ga)As] thereof can be also lattice-matched. The quantum-well structure is formed of InAl(Ga)As/InGaAs/InAl(Ga)As instead of the conventional AlGaAs/GaAs/AlGaAs. Accordingly, since the electron effective mass in the InAl(Ga)As barrier layer is smaller than that in the AlGaAs barrier layer, the tunneling probability through a barrier is increased and the scattering probability decreased, compared with the conventional AlGaAs barrier layer. As a result, a remarkable resonant tunneling effect occurs, and negative differential resistance characteristics with a large maximum (peak) current density $J_p$ and a large peak-to-valley current density ($J_p/J_v$) ratio is obtained.

In order to substantially lattice-match the well layer of $In_{1-y}Ga_yAs$ to InP, the mole fraction "y" can vary within the range of from 0.48 to 0.46, and when the mole fraction "y" is equal to 0.47, the well layer of $In_{0.53}Ga_{0.47}As$ is lattice-matched with InP. According to the second embodiment of the present invention, there is provided a resonant tunneling semiconductor device comprising: an InP substrate a first contact compound semiconductor layer formed on the InP substrate and barrier lattice-matched $Al_xAs$ ($0.48 < x \leq 1$) formed on the first contact layer and not lattice-matched to InP; a well layer of $In_{1-y}Ga_yAs$ formed on the first barrier layer and substantially lattice-matched to InP; a second barrier layer of $In_{1-x}Al_xAs$ ($0.48 < x \leq 1$) formed on the well layer and not lattice-matched to InP; and a second contact compound semiconductor layer formed on the second barrier layer and lattice-matched to InP; the first barrier layer, the second barrier layer and the well-layer forming a quantum-well structure of strained-layers, and the bottom of the conduction band $E_c$ of the first and second contact layers being lower than the first resonant level $E_0$ in the quantum-well at the nonbiased condition.

In this case, $In_{1-x}Al_xAs$ ($0.48 < x1$) is adopted for the barrier layer instead of InAl(Ga)As of the first embodiment of the present invention, to increase the barrier height of the quantum-well structure. Therefore, as the molar ratio "x" approaches the maximum value "1", the barrier height increases. The large barrier height provides a greater separation between the first resonant level E and the second resonant level $E_1$. The large barrier height and the greater separation cause the minimum (valley) current density $J_v$ to decrease, which contributes to the increase of the $J_p/J_v$ ratio. On the other hand, since the $In_{1-x}Al_xAs$ ($0.48 < x \leq 1$) layer is not lattice-matched to InP, the layer thickness is restricted, to prevent misfit dislocations from occurring and to form a strained-layer structure. Accordingly, the InAlAs barrier layer has a thickness of from 0.5 to 10.0 nm, more preferably, from 1.0 to 5.0 nm.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

A resonant tunneling semiconductor device according to a first embodiment of the present invention is now explained.

Figure 6:
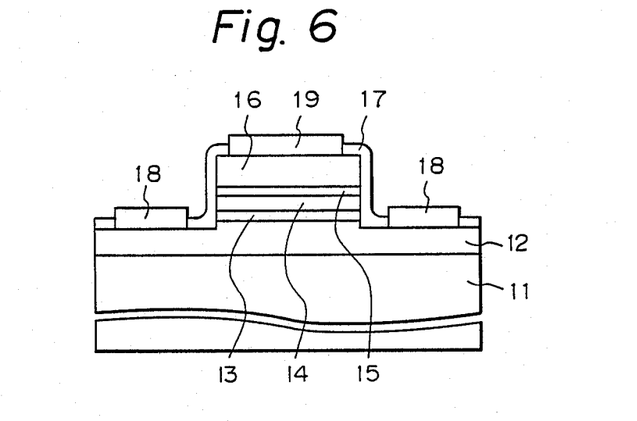
FIG. 6 is a schematic sectional view of an RTB diode according to the first embodiment of the present invention.

Referring to FIG. 6, an RTB (resonant tunneling barrier) diode according to the first embodiment comprises an InP substrate 11, a first contact layer 12 of a ternary or quaternary compound semiconductor, a first barrier layer 13 of a quaternary compound semiconductor InAl(Ga)As, a well layer 14 of $In_{1-y}Ga_yAs$ ($0.46 \leq y \leq 0.48$), a second barrier layer 15 of a mixed crystal InAl(Ga)As, a second contact layer 16 of a ternary or quaternary compound semiconductor, a protective insulating layer 17, a first ohmic-contact electrode 18, and a second ohmic-contact electrode 19. The layers 12 to 16 are lattice-matched to the InP substrate, and the first and second barrier layers 13 and 15 and the well layer 14 form a quantum-well structure. The RTB diode structure of FIG. 6 is almost the same as that of FIG. 1 except for the semiconductor materials used.

By way of example, the data of the parts of the RTB diode is as follows.

(a) InP substrate 11
Material: semi-insulating single crystalline InP (b) First contact layer 12
Material: n-type $In_{0.53}Ga_{0.47}As$
Impurity concentration: $1 \times 10^{18}$ cm$^{-3}$
Thickness: 0.5 μm (c) First barrier layer 13
Material: i-type $In_{0.52}Al_{0.48}As$
Thickness: 41 Å (4.1 nm)

(d) Well layer 14
Material: i-type $In_{0.53}Ga_{0.47}As$
Thickness: 62 Å (6.2 nm)

(e) Second barrier layer 15
Material: i-type $In_{0.52}Al_{0.48}As$
Thickness: 41 Å (4.1 nm)

(f) Second contact layer 16
Material: n-type $In_{0.53}Ga_{0.47}As$
Impurity concentration: $1 \times 10^{18}$ cm$^{-3}$
Thickness: 0.3 μm (g) Protective insulating layer 17
Material: Silicon dioxide ($SiO_2$)
Thickness: 0.3 μm (h) First and second electrode layers 18 and 19
Material: AuGe/Au or Cr/Au
Thickness: 20 nm/200 nm or 10 nm/200 nm
Alloying treatment: No In this case, the barrier layers 13 and 15 are obtained when the mole fraction "z" in $(In_{0.52}Al_{0.48}As)_z(In_{0.53}Ga_{0.47}As)_{1-z}$ is equal to zero. It is possible to use a quaternary compound semiconductor, such as InAlGaAs instead of the InGaAs of the first and second contact layers, but the compound semiconductor materials for the contact layers must meet the requirements that the lattice-matching to InP is attained and the bottom of conduction band $E_c$ thereof is lower than the first resonant level $E_0$ in the quantum-well at the nonbias condition. It is preferable to introduce undoped $In_{0.53}Ga_{0.47}As$ spacer layers between the first contact layer 12 and the first barrier layer 13 and between the second barrier layer 15 and the second contact layer 16, to suppress the possible diffusion of Si impurities from the n-type InGaAs contact layers 12 and 16 to the undoped barrier layers 13 and 15.

The above-mentioned RTB diode is produced as follows.

The first contact layer 12, the first barrier layer 13, the well layer 14, the second barrier layer 15, and the second contact layer 16 are consecutively grown on the InP substrate 11 by a molecular beam epitaxy (MBE) method. The formed multilayer body is selectively etched from the top surface to the first contact layer 12 by a conventional photolithography method, as shown in FIG. 6, so that a mesa portion of the multilayer body having a diameter of approximately 50 μm is formed. Then a protective insulating layer 17 is formed on the exposed surface by a chemical vapor deposition (CVD) method. The protective insulating layer 17 is selectively etched by a conventional photolithograph method, to open windows for the first and second contact layers 18 and 19. Then the contact layers 18 and 19 are formed by a vapor deposition method and a lift-off method.

Figure 7:
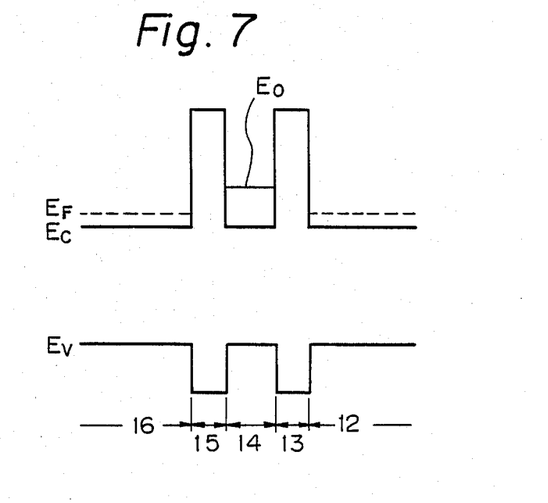
FIG. 7 is a schematic energy band diagram of the RTB diode of FIG. 6.

FIG. 7 shows a schematic energy band diagram of the RTB of FIG. 6 under a nonbias condition. There is no rise, descent, and inclination on the bottom $E_c$ of the conduction band caused by an applied voltage, but the barrier height of the barrier layers 13 and 15 is as clearly illustrated in FIG. 7. For example, the $In_{0.53}Ga_{0.47}As$ of the first and second contact layers 12 and 16 and of the well layer 14 has a forbidden band width (energy bandgap) of approximately 0.76 eV, and the $In_{0.52}Al_{0.48}As$ of the barrier layers 13 and 15 has a forbidden band width (energy bandgap) of approximately 1.47 eV, so that a barrier height of approximately 0.53 eV is obtained. As the proportion of ($In_{0.53}Ga_{0.47}As$) to the quaternary compound semiconductor of $(In_{0.53}Al_{0.48}As)_z(In_{0.53}Ga_{0.47}As)_{1-z}$ of the barrier layers increases, the barrier height decreases. Therefore, the barrier height can be controlled by changing the mole fraction "z".

Figure 8:
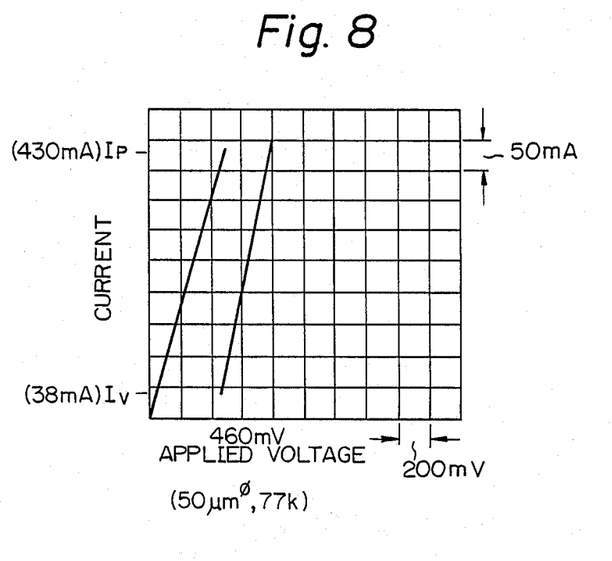
FIG. 8 is a current-voltage characteristic diagram of the RTB diode according to the present invention.

The RTB diode comprising the above-mentioned parts was tested at 77° K. to obtain the current-voltage characteristics shown in FIG. 8. As compared with FIG. 4 showing the AlGaAs/GaAs RTB, the maximum (peak) current $I_p$ of the RTB according to the first embodiment of the present invention is increased and the maximum (valley) current thereof remarkably decreased.

Figure 9:
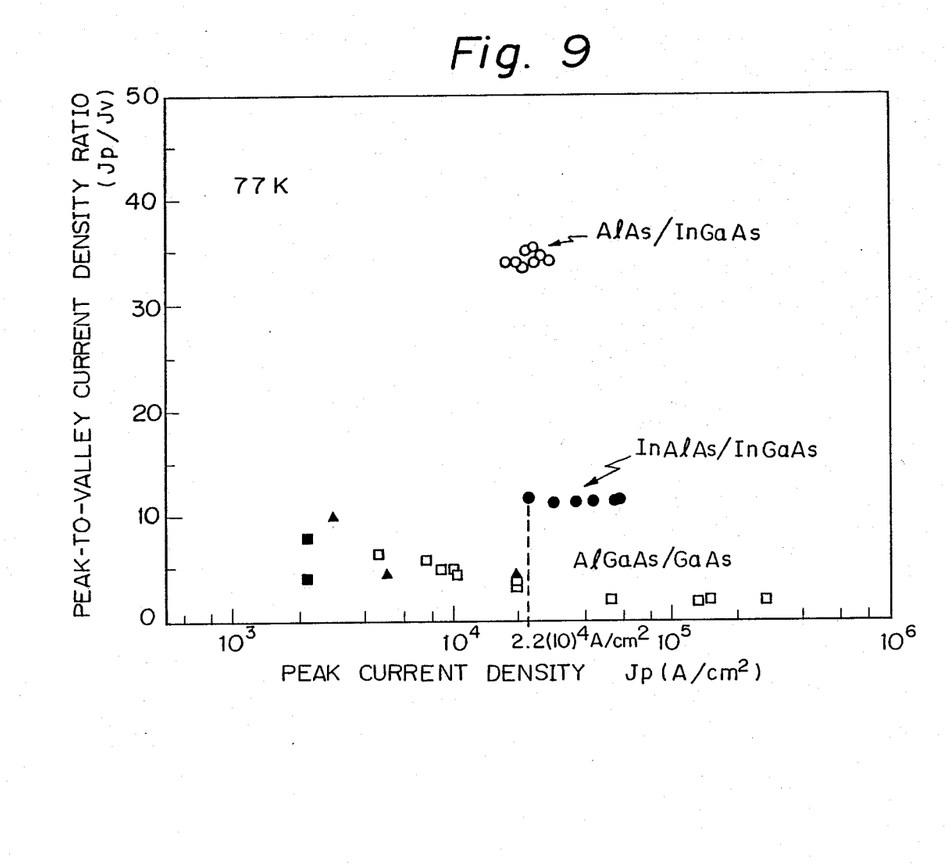
FIG. 9 is a diagram showing a relationship between $J_p/J_v$ ratios and the $J_p$ values of RTB diodes at 77° K.

The RTB diodes according to the first embodiment of the present invention have the maximum (peak) current density $J_p$ values and peak-to-valley current density ($J_p/J_v$) ratios indicated by solid circles (●), as shown in FIG. 9. As comparative examples ($J_p$ values and $J_p/J_v$ ratios) of conventional AlGaAs/GaAs RTB diodes is indicated by the solid triangles solid squares ( ), and open squares ( ). As can be seen from the drawing, for example, when the $J_p$ value is approximately equal to $2 \times 10^4$ A/cm$^2$, the $J_p/J_v$ ratio is approximately equal to 11.7, which is about four times greater than that of the AlGaAs/GaAs RTB diodes.

In order to further improve the negative differential resistance characteristics of a resonant tunneling semiconductor device (e.g., an RTB diode), $In_{1-x}Al_xAs$ ($0.48 < x \leq 1$) having a forbidden band width (energy bandgap) larger than that of the quaternary compound semiconductor of $(In_{0.52}Al_{0.48}As)_z(In_{0.53}Ga_{0.47}As)_{1-z}$, ($0 < z \leq 1$), [e.g., $In_{0.52}Al_{0.48}As$) ] can be adopted for the barrier layer material. However, the $In_{1-x}Al_xAs$ ($0.48 < x \leq 1$) layer is not lattice-matched with InP. In this case, it is possible to prevent misfit dislocation from occurring by adopting a strained-layer structure.

Therefore, a resonant tunneling semiconductor device according to a second embodiment of the present invention is provided with a quantum-well structure of the strained-layers in which the barrier layers are of $In_{1-x}Al_xAs$ ($0.48 < x \leq 1$). An RTB diode according to the second embodiment is explained with reference to FIG. 6, since the structure of the RTB diode is basically the same as that of the RTB diode according to the first embodiment except for the semiconductor materials used and dimensions thereof.

The RTB diode according to the second embodiment comprises an InP substrate 11, a first contact layer 12 of a ternary or quaternary compound semiconductor, a first barrier layer 13 of $In_{1-x}Al_xAs$ ($0.48 < x \leq 1$), a well layer 14 of $In_{1-y}Ga_yAs$ ($0.46 \leq y \leq 0.48$), a second barrier layer 15 of $In_{1-x}Al_xAs$ ($0.48 < x \leq 1$), a second contact layer 16 of a ternary or quaternary compound semiconductor, a protective insulating layer 17, a first ohmic-contact electrode 18, and a second ohmic-contact electrode 19.

By way of example, the data of the parts of the RTB diode is as follows.

(a) InP substrate 11
Material: semi-insulating single crystalline InP
(b) First contact layer 12
Material: n-type $In_{0.53}Ga_{0.47}As$
Impurity concentration: $1 \times 10^{18}$ cm$^{-3}$
Thickness: 0.5 μm
(c) First barrier layer 13
Material: i-type AlAs
Thickness: 24 Å (2.4 nm)
(d) Well layer 14
Material: i-type $In_{0.53}Ga_{0.47}As$
Thickness: 44 Å (4.4 nm)
(e) Second barrier layer 15
Material: i-type AlAs
Thickness: 24 Å (2.4 nm)
(f) Second contact layer 16
Material: n-type $In_{0.53}Ga_{0.47}As$
Impurity concentration: $1 \times 10^{18}$ cm$^{-3}$
Thickness: 0.3 μm
(g) Protective insulating layer 17
Material: Silicon dioxide ($SiO_2$)
Thickness: 0.3 μm
(h) First and second electrode layers 18 and 19
Material: AuGe/Au or Cr/Au
Thickness: 20 nm/200 nm or 10 nm/200 nm
Alloying treatment: No It is also possible to introduce undoped $In_{0.53}Ga_{0.47}As$ spacer layers between the first contact layer 12 and the first barrier layer 13 and between the second barrier layer 15 and the second contact layer 16.

In this case, the barrier layer 13 and 15 are obtained when the mole fraction "x" in $In_{1-x}Al_xAs$ is equal to one. The energy bandgap of AlAs is 3.03 eV. Therefore, where the molar ratio "x" in the $In_{1-x}Al_xAs$ barrier layer varies from more than 0.48 up to 1, the energy bandgap thereof varies from more than 1.47 eV up to 3.03 eV, which is larger than that of the $(In_{0.52}Al_{0.48}As)_z(In_{0.53}Ga_{0.47}As)_{1-z}$ barrier layer according to the first embodiment of the present invention. Consequently, the barrier height of the $In_{1-x}Al_xAs$ barrier layers becomes more than 0.53 eV. As the molar ratio "x" increases, the separation between the first and second resonant layers in the well layer increases. The larger barrier height and the greater separation contribute to a decrease of the minimum (valley) current density $J_v$ and increase of the $J_p/J_v$ ratio.

In order to make the quantum-well structure including the $In_{1-x}Al_xAs$ barrier of strained-layers, it is necessary to restrict the thickness of the $In_{1-x}Al_xAs$ barrier layers up to a critical layer thickness of 100 Å (10.0 nm). Therefore, the $In_{1-x}Al_xAs$ barrier layer has a thickness of from 5 to 100 Å (0.5 nm to 10.0 nm), preferably, 10 Å to 50 Å (1.0 nm to 5.0 nm).

The RTB diodes comprising the above-mentioned parts have maximum (peak) current density $J_p$ values and peak-to-valley current density $J_p/J_v$ ratios, at 77° K., indicated with open circles (o), as shown in FIG. 9. As can be seen from the drawing, the $J_p/J_v$ ratios of the RTB (AlAs/InGaAs) diodes according to the second embodiment of the present invention are much larger than those of the RTB (InAlAs/InGaAs) diodes according to the first embodiment and those of the conventional RTB (AlGaAs/GaAs) diodes.

Figure 10:
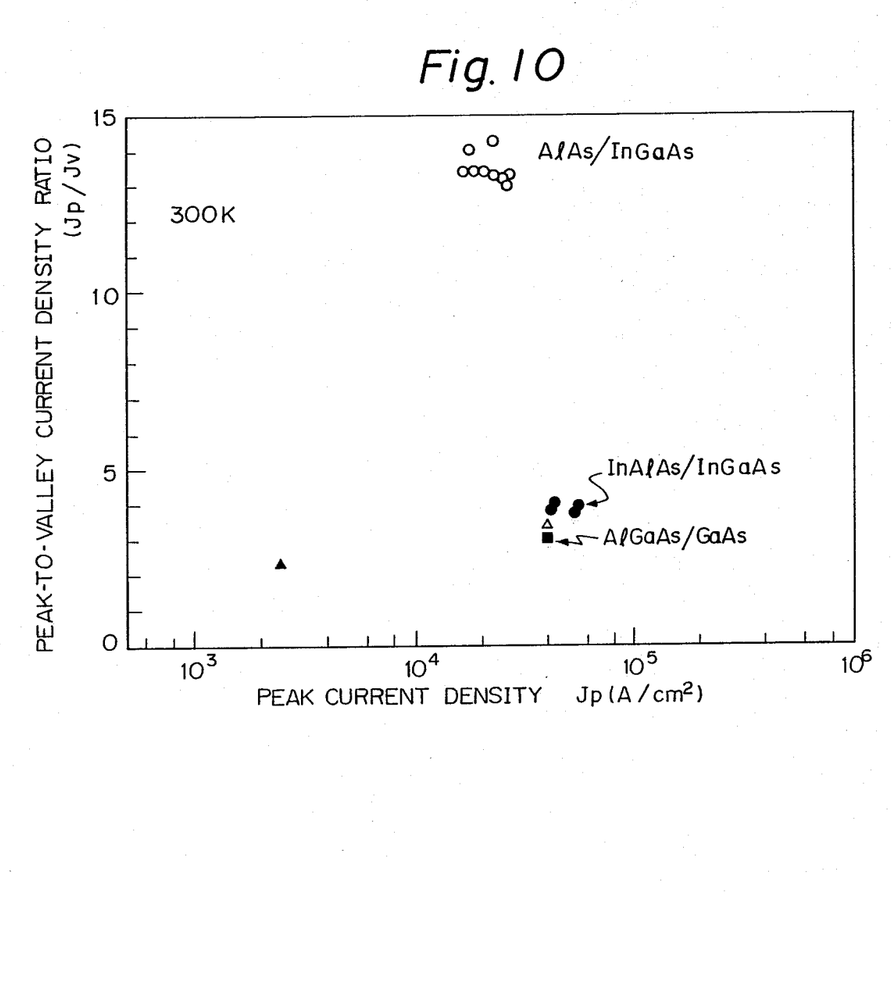
FIG. 10 is a diagram showing a relationship between $J_p/J_v$ ratios and the $J_p$ values of RTB diodes at 300° K.

FIG. 10 is similar to FIG. 9 and shows data of the $J_p$ and $J_p/J_v$ ratios for the RTB diodes according to the first and second embodiments and the conventional RTB diodes, of which data were obtained by testing at 300° K. The $J_p/J_v$ ratios (at 300° K.) of the RTB (AlAs/InGaAs) diodes according to the second embodiment are remarkably smaller than those (at 77) shown in FIG. 9, but are much larger than those of the RTB (InAlAs/InGaAs) diodes according to the first embodiment and those of the conventional RTB (AlGaAs/GaAs) diodes.

Figure 11:
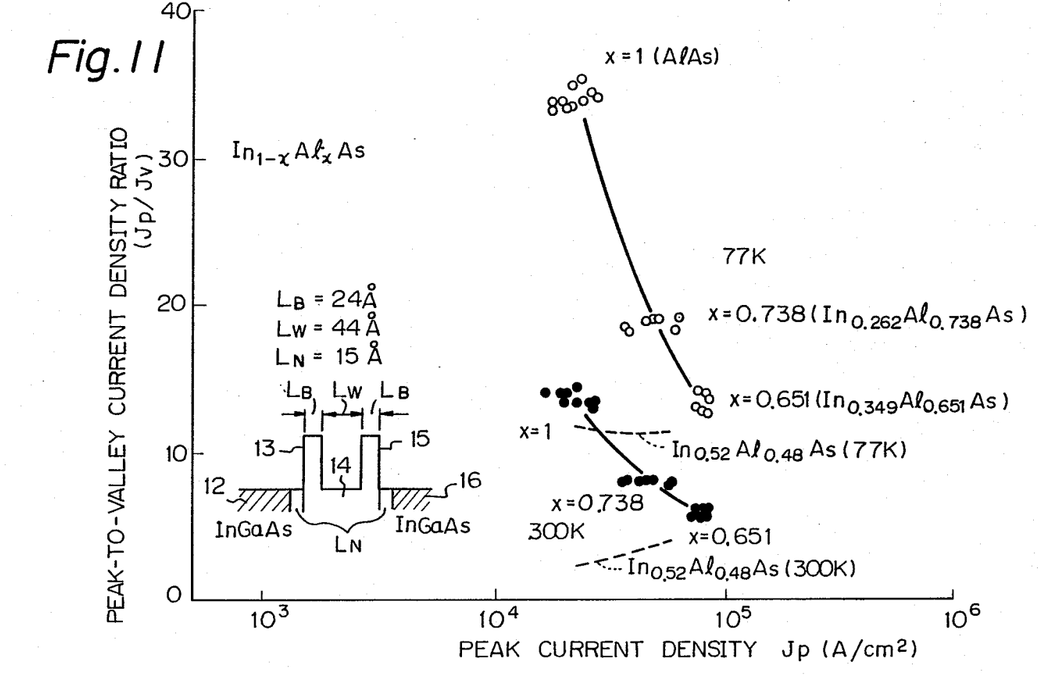
FIG. 11 is a diagram showing a relationship between $J_p/J_v$ ratios and the $J_p$ values of RTB diodes having $In_{1-x}Al_xAs$ barrier layers.

FIG. 11 shows data of the RTB diodes including the $In_{1-x}Al_xAs$ ($0.48 \leq x \leq 1$) barrier layers of the present invention, in which the mole fraction "x" is used as a parameter. The RTB diodes comprise the above-mentioned parts (shown in FIG. 6) according to the second embodiment except for the variation of the composition of In(Al)As barrier layers 13 and 15 and the insertion of spacer layers of undoped InGaAs between the first contact layer 12 and the first barrier layer 13 and between the second barrier layer 15 and the second contact layer 16. The thickness ($L_N$) of the spacer layers is approximately 15 Å (1.5 nm). Therefore, the quantum-well structure is formed of the $In_{1-x}Al_xAs$ barrier layers 13 and 15 having a thickness ($L_B$) of 24 Å (2.4 nm) and the InGaAs well layer 14 having a thickness of 44 Å (4.4 nm).

As can be seen from FIG. 11, the $J_p/J_v$ ratios (at 77° K. and at 300° K.) of the RTB diodes having the AlAs barrier layer at the mole fraction "x" of 1 are superior to those of the RTB diodes having the $In_{0.52}Al_{0.48}As$ barrier layers according to the first embodiment of the present invention. Taking FIGS. 9 and 10 into consideration, it is obvious that the $J_p/J_v$ ratios shown in FIG. 11 are superior to those of the conventional RTB (AlGaAs/GaAs) diodes.

Figure 12:
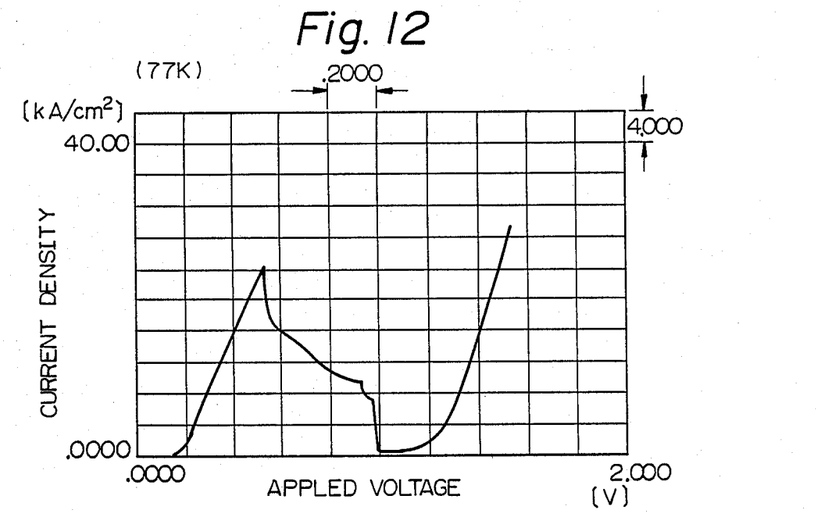
FIGS. 12 and 13 are current density-voltage characteristics diagrams of an RTB diode having the AlAs barrier layers according to the second embodiment of the present invention, at 77° K., and 300° K., respectively; a layer to of FIG. 14 is a schematic sectional view of the RHET according to the present invention.
Figure 13:
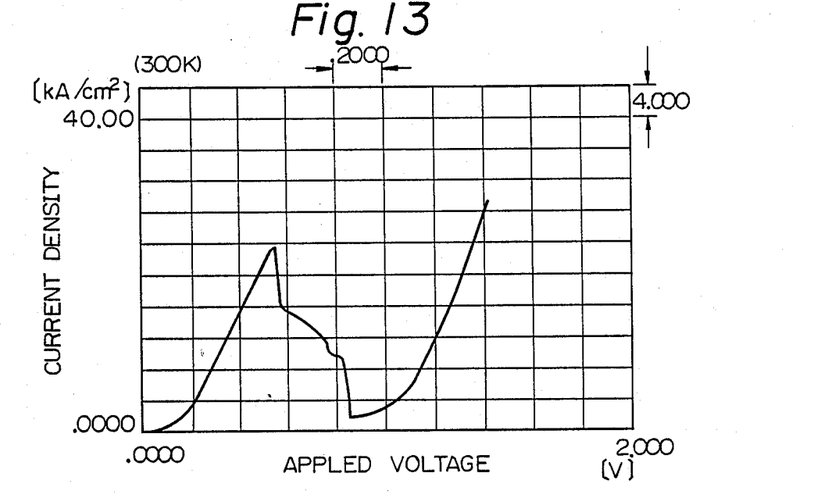

The RTB diode comprising the AlAs barrier layers according to the second embodiment of the present invention was tested at temperatures of 77° K. and 300° K., to obtain the current density-voltage characteristics shown in FIGS. 12 and 13, respectively. As can be seen from the drawings, although the $J_p$ values are almost constant, the $J_v$ value at 77° K. is lower than the $J_v$ value at 300° K. and approaches zero. Accordingly the $J_p/J_v$ ratio at 77° K. becomes very much larger than that at 300° K.

Figure 14:
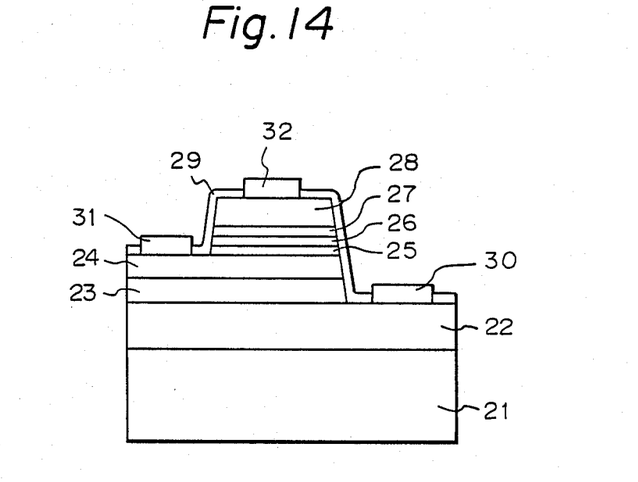

Referring to FIG. 14, an RHET (resonant tunneling hot election transistor) according to the present invention is explained hereinbelow.

The RHET comprises an InP substrate 21, a collector layer 22 of n+-type $In_{0.53}Ga_{0.47}As$, a collector barrier layer 23 of i-type InGaAlAs, a base layer 24 of n-type $In_{0.53}Ga_{0.47}As$, a first barrier layer 25, a well layer 26 of i-type $In_{0.53}Ga_{0.47}As$, a second barrier layer 27, an emitter layer 28 of $n^+$-type $In_{0.53}Ga_{0.47}As$, a protective insulating layer 29 of $SiO_2$, and ohmic-contact electrodes 30, 31 and 32. The barrier layers 25 and 27 and a well layer 26 form a quantum-well structure in accordance with the first or second embodiment of the present invention. For example, the barrier layers 25 and 27 are of i-type $In_{0.52}Al_{0.48}As$ and have a thickness of 41 Å (4.1 nm), or are of i-type AlAs and have a thickness of 24 Å (2.4 nm).

Figure 15:
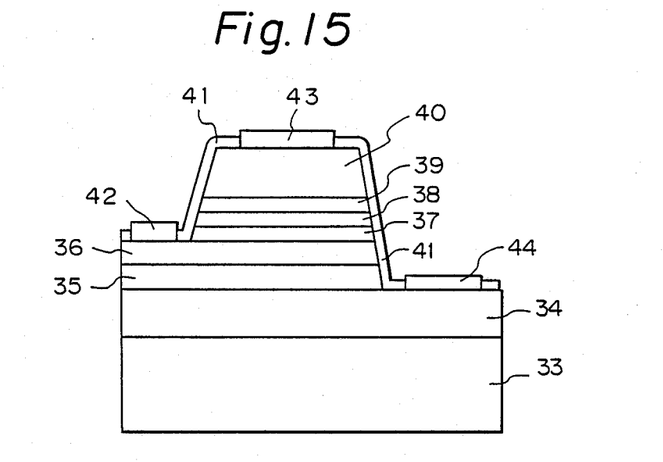
FIG. 15 is a schematic sectional view of the RTB according to the present invention.

Referring to FIG. 15, an RBT (resonant tunneling bipolar transistor) according to the present is explained hereinbelow.

The RBT comprises an InP substrate 33, a collector contact layer 34 of $n^+$-type $In_{0.53}Ga_{0.47}As$, a collector layer 35 of n-type $In_{0.53}Ga_{0.47}As$, a base layer 36 of P-type $In_{0.53}Ga_{0.47}As$, a first barrier layer 37, a well layer 38 of i-type $In_{0.53}Ga_{0.47}As$, a second barrier layer 39, an emitter layer 40 of $n^+$-type $In_{0.53}Ga_{0.47}As$, a protective insulating layer 41 of $SiO_2$, and ohmic-contact electrodes 42, 43 and 44. The barrier layers 37 and 39 and a well layer 38 form a quantum-well structure in accordance with the first or second embodiment of the present invention. For example, the barrier layer 37 and 39 are of i-type $In_{0.52}Al_{0.48}As$ and have a thickness of 41 Å (4.1 nm), or are of i-type AlAs and have a thickness of 24 Å (2.4 nm).

It will be obvious that the present invention is not restricted to the above-mentioned embodiments and that many variations are possible for persons skilled in the art without departing from the scope of the invention. For example, although the above-mentioned quantum-well structure has a symmetrical structure in which the composition (i.e., barrier height) and the thickness (i.e., barrier width) of the barrier layers are equal to each other, it is possible to adopt a asymmetrical structure in which the composition and/or the thickness of one of the barrier layers are different from the other barrier layer.

We claim:

1. (Once Amended) A resonant tunneling semiconductor device comprising:
   an InP substrate;
   a first contact compound semiconductor layer formed on said InP substrate and lattice-matched to InP;
   a first barrier layer of $(In_{0.52}Al_{0.48}As)_z(In_{0.53}Ga_{0.47}As)_{1-z}$ ($0<z\leq1$), formed on said first contact compound semiconductor layer and lattice-matched to InP;
   a well layer of $In_{1-y}Ga_yAs$ formed on said first barrier layer and substantially latticed-matched to InP;
   a second barrier layer of $(In_{0.52}Al_{0.48}As)_z(In_{0.53}Ga_{0.47}As)_{1-z}$ ($0<z\leq1$) formed on said well layer and lattice-matched in InP; and
   a second contact compound semiconductor layer formed on said second barrier layer and lattice-matched to InP, said
   first barrier layer, said second barrier layer and said well-layer forming a quantum-well structure, and a bottom of a conduction band $E_c$ of said first and second contact compound semiconductor layers is lower than a first resonant level $E_0$ of the quantum-well structure under a nonbiased condition, said InP substrate, said first contact compound semiconductor layer, said first barrier layer, said well layer, said second barrier layer and said second contact compound semiconductor layer providing a negative differential resistance characteristic at resonance having a maximum/minimum current ratio greater than 5.5.

2. A resonant tunneling semiconductor device according to claim 1, wherein said first contact compound semiconductor layer comprises a material selected from a group consisting of ternary compound semiconductor and quaternary compound semiconductor.

3. A resonant tunneling semiconductor device according to claim 2, wherein said ternary semiconductor comprises $In_{0.53}Ga_{0.47}As$.

4. A resonant tunneling semiconductor device according to claim 1, wherein the mole fraction "z" of said first barrier layer is equal to one and said first barrier layer comprises $In_{0.52}Al_{0.48}As$.

5. A resonant tunneling semiconductor device according to claim 1, wherein the mole fraction "y" of said well layer is selected from within a range of 0.48 to 0.46.

6. A resonant tunneling semiconductor device according to claim 5, wherein the mole fraction "y" is equal to 0.47 and said well layer comprises $In_{0.53}Ga_{0.47}As$.

7. A resonant tunneling semiconductor device according to claim 1, wherein (where) the mole fraction "z" of said second barrier layer is equal to one and said second barrier layer comprises $In_{0.52}Al_{0.48}As$.

8. A resonant tunneling semiconductor device according to claim 1, wherein said second contact compound semiconductor layer comprises a material selected from the group consisting of a ternary compound semiconductor and a quaternary compound semiconductor.

9. A resonant tunneling semiconductor device according to claim 8 wherein said ternary compound semiconductor comprises $In_{0.53}Ga_{0.47}As$.

10. A resonant tunneling semiconductor device according to claim 1, further comprising:
    a first electrode contacting said first contact compound layer; and
    a second electrode contacting said second contact compound layer.

11. A resonant tunneling semiconductor device according to claim 1, further comprising:
    a collector layer of a compound semiconductor formed on said InP substrate, and said collector layer having a first conductivity type; and
    a collector barrier layer of a compound semiconductor formed on said collector layer, and said collector barrier layer forming a barrier at a junction with said collector layer;
    said first contact compound semiconductor layer comprising a base layer and having the first conductivity type, and
    said second contact compound semiconductor layer comprising an emitter layer and having the first conductivity type.

12. A resonant tunneling semiconductor device according to claim 1, further comprising:
    a collector layer of a compound semiconductor formed on said InP substrate, and said collector layer having a first conductivity type;
    said first contact compound semiconductor layer comprising a base layer and having a second conductivity type which is opposite to the first conductivity type, said second contact compound semiconductor comprising an emitter layer and having the first conductivity type.

13. A resonant tunneling semiconductor device comprising:
an InP substrate;
a first contact compound semiconductor layer formed on said InP substrate and lattice-matched to InP;
a first barrier layer of $In_{1-x}Al_xAs$ ($0.48 < x \leq 1$) having a thickness from 0.5 to 10 nm, formed on said first contact compound semiconductor layer and not lattice-matched to InP;
a well layer of $In_{1-y}Ga_yAs$ formed on said first barrier layer and substantially lattice-matched to Inp;
a second barrier layer of $In_{1-x}Al_xAs$ ($0.48 < x \leq 1$) having a thickness from 0.5 to 10 nm, formed on said well layer and not lattice-matched to InP; and
a second contact compound semiconductor layer formed on said second barrier layer and lattice-matched to InP; said first barrier layer, said second barrier layer and said well-layer forming a quantum-well structure of strained-layers whereby a bottom of a conduction band $E_c$ of said first and second contact layers is lower than a first resonant level $E_0$ of said quantum-well under a nonbiased condition.

14. A resonant tunneling semiconductor device according to claim 13, wherein said first contact compound semiconductor layer comprises a material selected from the group consisting of a ternary compound semiconductor and a quaternary compound semiconductor.

15. A resonant tunneling semiconductor device according to claim 13, wherein said ternary semiconductor comprises $In_{0.53}Ga_{0.47}As$.

16. A resonant tunneling semiconductor device according to claim 13, wherein (where) the mole fraction "x" of said first barrier layer is equal to 1 and said first barrier layer comprises AlAs.

17. A resonant tunneling semiconductor device according to claim 13, wherein the mole fraction "y" of said well layer is selected from a range of 0.48 to 0.46.

18. A resonant tunneling semiconductor device according to claim 17, wherein the mole fraction "y" is equal to 0.47 and said well layer comprises $In_{0.53}Ga_{0.47}As$.

19. A resonant tunneling semiconductor device according to claim 13, wherein the mole fraction "x" of said second barrier layer is equal to 1 and said second barrier layer comprises AlAs.

20. A resonant tunneling semiconductor device according to claim 13, wherein the thickness of said first and second barrier layers is from 1.0 to 5.0 nm.

21. A resonant tunneling semiconductor device according to claim 13, wherein said second contact compound semiconductor layer comprises a material selected from the group consisting of a ternary compound semiconductor and a quaternary compound semiconductor.

22. A resonant tunneling semiconductor device according to claim 21 wherein said ternary semiconductor comprises $In_{0.53}Ga_{0.47}As$.

23. A resonant tunneling semiconductor device according to claim 13, further comprising:
a first electrode contacting said first contact compound semiconductor layer; and
a second electrode contacting said second contact compound semiconductor layer.

24. A resonant tunneling semiconductor device according to claim 13, further comprising:
a collector layer of a compound semiconductor formed on said InP substrate, and said collector layer having a first conductivity type; and p1 a collector barrier layer of a compound semiconductor formed on said collector layer, and said collector barrier layer forming a barrier at a junction with said collector layer;
said first contact compound semiconductor layer comprising a base layer and having the first conductivity type,
said second contact compound semiconductor layer comprising an emitter layer and having the first conductivity type.

25. A resonant tunneling semiconductor device according to claim 13, further comprising:
a collector layer of a compound semiconductor formed on said InP substrate, and said collector layer having a first conductivity type;
said first contact compound semiconductor layer comprising a base layer and having a second conductivity type which is opposite to the first conductivity type,
said second contact compound semiconductor layer comprising an emitter layer and having the first conductivity type.

26. A resonant tunneling semiconductor device according to claim 13, wherein said
layers provide a negative differential resistance characteristic at resonance having a maximum/minumum current ratio greater than 5.5.

27. A resonant tunneling semiconductor device as recited in claim 27, wherein said ratio is greater that 10.

28. A resonant tunneling semiconductor device as recited in claim 1, wherein said ratio is greater that 10.

* * * * *

UNITED STATES PATENT AND TRADEMARK OFFICE
CERTIFICATE OF CORRECTION

PATENT NO. : 4,825,264

DATED : APRIL 25, 1989

INVENTOR(S) : TSUGUO INATA ET AL.

It is certified that error appears in the above-identified patent and that said Letters Patent is hereby corrected as shown below:

FRONT PAGE, Col. 2, line 5, "/InGaAs" should be --/InGaAs,--;

[57] Abstract, line 4, "Inp," should be --InP,--.

*Col. 2, line 11, delete "the".

Col. 3, line 59, start a new paragraph, with paragraph indentation, beginning with "According";

line 64, "and            " should be --and lattice-matched to InP; a first--;

line 64, "lattice-matched" should be --lattice layer of--;

line 65, "$Al_xAs$" should be --$In_{1-x}Al_xAs$--.

Col. 4, line 10, "(0.48 <x1)" should be --(0.48 <x$\leq$1)--;

line 18, "E" should be --$E_0$--;

line 64, delete "layer        to        of";

line 64, delete "and";

line 66, "invention." should be --invention; and--.

UNITED STATES PATENT AND TRADEMARK OFFICE
CERTIFICATE OF CORRECTION

PATENT NO. : 4,825,264

DATED : APRIL 25, 1989

INVENTOR(S) : TSUGUO INATA ET AL.

It is certified that error appears in the above-identified patent and that said Letters Patent is hereby corrected as shown below:

Col. 5, line 32, "(c) Eirst" should be --(c) First--;

line 53, "$In_{05}$-" should be --$In_{0.5}$- --.

Col. 6, line 50, "triangles" should be --triangles (▲),--;

line 50, "( )," should be -- (■),--;

line 51, "( )." should be --(□).--;

line 62, "As)]" should be --As]--.

Col. 8, line 4, "Åto" should be --Å to--;

line 41, "thickness of" should be --thickness ($L_W$) of--.

Col. 9, line 12, "present is" should be --present invention is--;

line 41, "delete "(Once Amended)";

line 58, after "said", continue with line 56, with no paragraph indentation.

Col. 10, line 26, delete "(where)".

UNITED STATES PATENT AND TRADEMARK OFFICE
CERTIFICATE OF CORRECTION

PATENT NO. : 4,825,264

DATED : APRIL 25, 1989

INVENTOR(S) : TSUGUO INATA ET AL.

It is certified that error appears in the above-identified patent and that said Letters Patent is hereby corrected as shown below:

Col. 11, line 16, "Inp;" should be --InP;--;

line 41, delete "(where)".

Col. 12, line 11, "21" should be --21,--;

line 23, delete "pl";

line 23, start a new paragraph, with paragraph indentation, beginning with "a" (second occurrence).

Signed and Sealed this

First Day of August, 1989

Attest:

DONALD J. QUIGG

Attesting Officer

Commissioner of Patents and Trademarks